(12) United States Patent
Yoshida

(10) Patent No.: US 6,476,616 B2
(45) Date of Patent: Nov. 5, 2002

(54) CONNECTOR CONTINUITY CHECKING DEVICE

(75) Inventor: Haruki Yoshida, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/765,436

(22) Filed: Jan. 22, 2001

(65) Prior Publication Data

US 2001/0010466 A1 Aug. 2, 2001

(30) Foreign Application Priority Data

Jan. 26, 2000 (JP) ........................... 2000-017197

(51) Int. Cl.[7] ............... H01H 31/04; H01R 3/00
(52) U.S. Cl. ........................ 324/538; 439/489
(58) Field of Search ................ 324/538, 158.1, 324/754, 761; 439/489, 310

(56) References Cited

U.S. PATENT DOCUMENTS

| | | | |
|---|---|---|---|
| 5,512,833 A | 4/1996 | Fukuda et al. | 324/538 |
| 5,718,603 A | 2/1998 | Watanabe et al. | 439/489 |
| 5,877,622 A * | 3/1999 | Aoyama et al. | 324/158.1 |
| 6,081,124 A * | 6/2000 | Chiyoda et al. | 324/538 |

FOREIGN PATENT DOCUMENTS

| | | |
|---|---|---|
| GB | 2 113 480 | 8/1983 |
| JP | 62-47093 | 12/1987 |
| JP | 8-008027 | 1/1996 |
| JP | A-8 248 089 | 9/1996 |
| JP | 8-248089 | 9/1996 |

OTHER PUBLICATIONS

Copy of European Patent Office Communication including European Search Report for Corresponding European patent application 01101437.01–1524 dated Jul. 11, 2001.

* cited by examiner

Primary Examiner—N. Le
Assistant Examiner—James Kerveros
(74) Attorney, Agent, or Firm—Armstrong, Westerman & Hattori, LLP

(57) ABSTRACT

In a connector continuity checking device comprising continuity checking pins 38 corresponding to terminals 41 in a connector 32, and lance displacement detecting pins 34 corresponding to lances 44 having elasticity and adapted to lock the terminals, the continuity checking pins 38 are respectively provided at their distal ends with concave terminal receiving portions 55 to receive distal ends of the terminals 41, and the lance displacement detecting pins 34 are respectively provided at their distal ends with concave lance receiving portions 56 to receive distal ends of the lances 44. The concave terminal receiving portions 55 and the concave lance receiving portions 56 are formed in a U-shape or a V-shape in cross section.

2 Claims, 4 Drawing Sheets

CONNECTOR CONTINUITY CHECKING DEVICE

BACKGROUND OF THE INVENTION

1. Field of the Invention

The present invention relates to a connector continuity checking device, which can perform inspection of electrical continuity and detection of incomplete insertion of terminals in a connector.

2. Description of the Related Art

In FIG. 7, a conventional connector continuity checking device 1 has a connector holding part 3 substantially in a shape of gateposts in which a connector 2 is adapted to be set, and a checking part 4 arranged movably back and forth with respect to the connector holding part 3.

The checking part 4 has a main block 5 of a hollow rectangular shape. In a connector engaging chamber 6 in the main block 5 are arranged a plurality of continuity checking pins 8 in a columnar shape which is capable of contacting with terminal 7 (see FIG. 8) in the connector 2, and a plurality of lance displacement detecting pins 9 in a form of a plate having a tapered tip end for detecting incomplete insertion of the terminals 7 (see FIG. 8).

The continuity checking pins 8 and the lance displacement detecting pins 9 are formed of metal. Each of the lance displacement detecting pins 9 includes an integral block portion 10 in a rectangular shape at its base side. The continuity checking pin 8 and the lance displacement detecting pin 9 are separated by an insulating sleeve 11 and fixed by press fitting. In other words, the insulating sleeve 11 of synthetic resin is press fitted around the continuity checking pin 8, and the block portion 10 made of metal is press fitted around the insulating sleeve 11.

The continuity checking pin 8, the insulating sleeve 11 and the lance displacement detecting pin 9 constitute a piece of set pin 12. It is to be noted that the insulating sleeve 11 is formed from a round rod by drilling and cutting around an outer periphery, and provided with a flange 13 for positioning and stopping the block portion 10 at its rearward end.

The continuity checking pin 8 is resiliently biased toward the connector holding part 3 by means of a coil spring 14 (see FIG. 8). The block portion 10 of the lance displacement detecting pin 9 is guided along a bore 15 in the main block 5 to move back and forth. The connector holding part 3 is fixed to a frame 16 by way of coil springs 17. The main block 5 is designed so as to slide on the frame 16 along guide shafts 19 by way of links (not shown) by actuating a lever 18 to rotate.

When the connector 2 is inserted into the connector holding part 3 from above in FIG. 7, and the lever 18 is rotated forward to move the main block 5 toward the connector 2, a front half portion of the connector 2 is inserted into the main block 5 and distal ends of the continuity checking pins 8 are brought into contact with distal ends of the terminals 7. Electric wires 20 (see FIG. 7) connected to the terminals and electric wires 21 connected to the continuity checking pins 8 are connected to a checker (not shown), and presence of electrical continuity in the terminals 7 can be confirmed by flashing of a lamp of the checker.

When one of the terminals has not been completely inserted into a terminal receiving chamber 23 in a connector housing 22 as represented by an upper terminal 7a in FIG. 8, a flexible locking lance 24 in the connector housing 22 is still in a flexed state in a flexing space 25. Accordingly, a distal end of the lance displacement detecting pin 9 is abutted against a tip end of the flexible locking lance 24 to prevent a further movement of the continuity checking pin 8. Thus, the continuity checking pin 8 cannot be brought into contact with the terminal 7a, resulting in a defective conduction, and the incomplete insertion of the terminal 7a can be detected.

By the way, in the above described prior art, it has been concerned that when the distal end of the lance displacement detecting pin 9 is abutted against the distal end of the flexible locking lance 24, its speed and load may move both the lance displacement detecting pin 9 and the flexible locking lance 24 in either of upward and downward directions. In this case, the flexible locking lance 24 is likely to escape in upward or downward direction and there is a fear that even the incomplete insertion like the terminal 7a may be recognized as being electrically continued. It is to be noted that the above described may be concerned with a position of the flexible locking lance 24 within a dimensional tolerance, a size of the terminal 7 within the dimensional tolerance and so on.

Meanwhile, because the continuity checking pin 8 and the lance displacement detecting pin 9 are integrally fixed, there is a fear that in case where the lance displacement detecting pin 9 is not positioned accurately, the continuity checking pin 8 becomes out of positional alignment with the terminal 7, when the lance displacement detecting pin 9 is inserted into the flexing space 25 from a front opening 26 (see FIG. 8). Thus accuracy of the continuity detection may be deteriorated.

The present invention has been made in view of the above circumstances, and its object is to provide a connector continuity checking device with high accuracy.

SUMMARY OF THE INVENTION

In order to solve the above described problems, there is provided according to the present invention, a connector continuity checking device comprising continuity checking pins corresponding to terminals in a connector, and lance displacement detecting pins corresponding to lances having elasticity and adapted to lock the terminals, wherein the continuity checking pins are respectively provided at their distal ends with concave terminal receiving portions to receive distal ends of the terminals, and the lance displacement detecting pins are respectively provided at their distal ends with concave lance receiving portions to receive distal ends of the lances.

According to another aspect of the invention, the concave terminal receiving portions and the concave lance receiving portions are formed in a U-shape or a V-shape in cross section.

According to a first aspect of the present invention, when the distal end of the continuity checking pin has come in contact with the distal end of the terminal for the check, the terminal is guided by the terminal receiving portion. Because the continuity checking pin and the lance displacement detecting pin are integrally fixed, even though the lance displacement detecting pin is not accurately positioned, the continuity checking pin can reliably catch the distal end of the terminal. The check with high accuracy can be thus obtained.

Moreover, in case where the terminal has been incompletely inserted, when the distal end of the lance displacement detecting pin has come in contact with the distal end of the lance, the distal end of the lance is guided by the lance receiving portion. Even though the lance displacement detecting pin is abutted against the lance on occasion of the check and apt to wobble with its speed and load, the lance displacement detecting pin will not escape from the distal end of the lance, since the distal end of the lance has been inserted into the lance receiving portion. Similarly, even though there are differences in the position of the lance within the dimensional tolerance and in the size of the terminal within the dimensional tolerance, the lance displacement detecting pin will not escape from the distal end of the lance. Accordingly, the incomplete insertion of the terminal can be reliably detected, and the check with high accuracy can be obtained.

According to the second aspect of the invention, guiding the distal ends of the terminal and the lance will be facilitated, and a wider guiding area can be obtained than with a simple recess.

DESCRIPTION OF THE PREFERRED EMBODIMENTS

Figure 1:
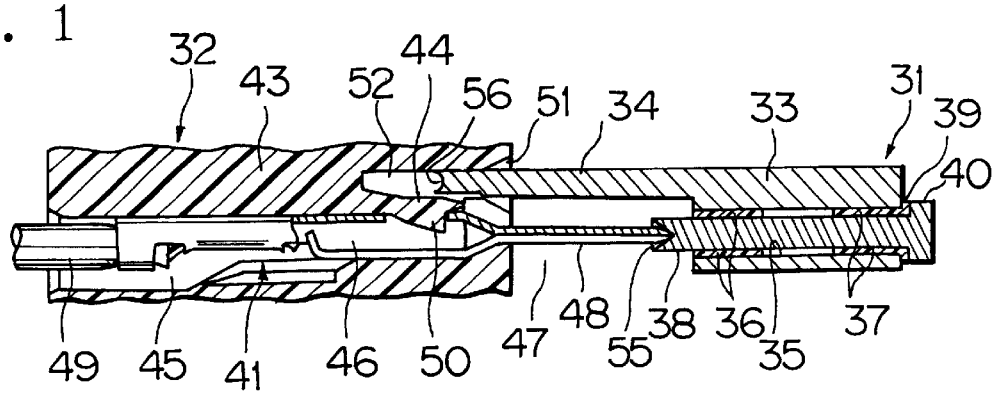
FIG. 1 is a sectional view of an essential part of a connector continuity checking device according to one embodiment of the present invention.

Now, one embodiment of the present invention will be described referring to the drawings.

Figure 2:
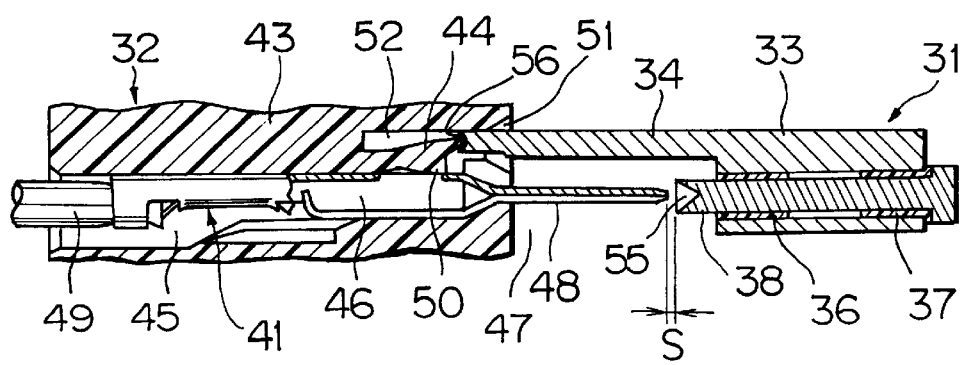
FIG. 2 is a sectional view of the essential part in a state where a terminal is incompletely inserted in contrast with FIG. 1.
Figure 7:
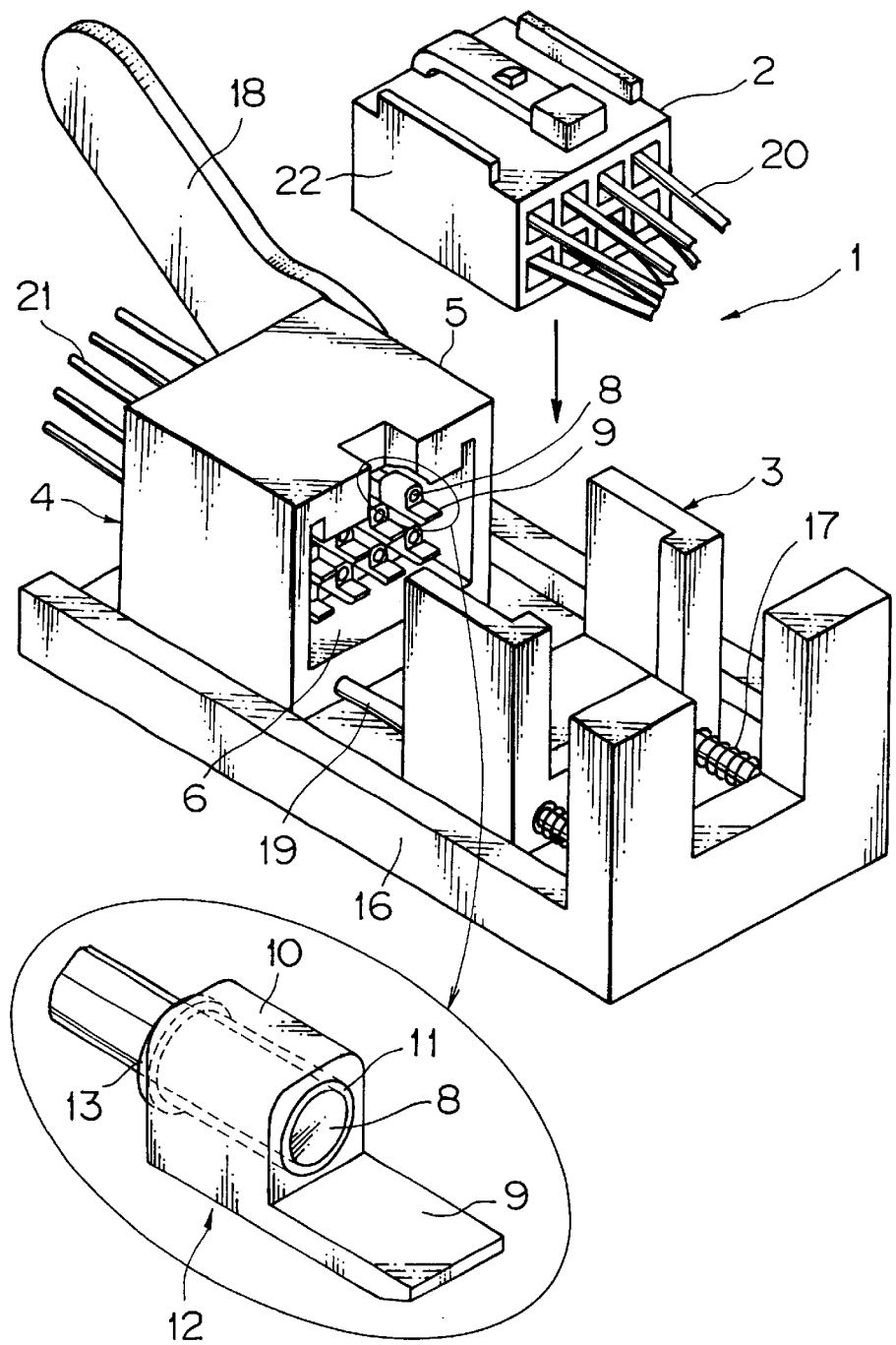
FIG. 7 is a perspective view of a conventional connector continuity checking device.

FIG. 1 is a sectional view of an essential part of a connector continuity checking device according to the embodiment of the present invention. FIG. 2 is a sectional view of the essential part in a state where a terminal is incompletely inserted in contrast with FIG. 1. The connector holding part and the driving mechanism of the checking part and so on are similar to those in the conventional case (see FIG. 7), and they are omitted from the drawings.

In FIG. 1, numeral 31 represents a set pin of the connector continuity checking device, and numeral 32 represents a connector to be set on the connector continuity checking device.

The set pin 31 is composed of a lance displacement detecting pin 34 made of metal and integrally projecting from a front end of a block section 33 made of metal in a rectangular shape, a pair of forward and rearward insulating sleeves 36, 37 made of synthetic resin which are press fitted in a bore 35 passing through the block section 33, a continuity checking pin 38 made of metal and press fitted into an inner diameter part of the insulating sleeves 36, 37.

The insulating sleeves 36 and 37 are separately arranged in a longitudinal direction of the set pin 31. In short, the forward insulating sleeve 36 is positioned at the front end of the block section 33 of the lance displacement detecting pin 34, while the backward insulating sleeve 37 is positioned at the backward end of the block section 33. The backward insulating sleeve 37 has an integral flange portion 39 which is adapted to be abutted against the backward end of the block section 33. Respective lengths of the insulating sleeves 36, 37 are the same excluding the flange portion 39, having a length of about one third of the block section 33.

The insulating sleeves 36, 37 are formed of strong engineering plastic material such as POM, etc. having a small thickness. In one example, the insulating sleeves 36, 37 are set to have a length of about 6 mm, and a thickness of about 0.4 mm. The insulating sleeves 36, 37, the continuity checking pin 38, and the block section 33 are fixed by press fitting. The continuity checking pin 38 is integrally provided, at its backward end, with a flange portion 40 which is adapted to be abutted against the flange portion 39 of the backward insulating sleeve 37.

Under a condition as shown in FIG. 1, a male terminal 41 has been completely inserted into the connector 32. The connector 32 has been inserted into a checking part 42 (see FIG. 6) of the connector continuity checking device. The terminal 41 is locked by a lance 44 of the connector housing 43 formed of synthetic resin. The lance 44 is formed in a shape of an arm having flexibility. The terminal 41 has a body portion 46 to be contained in a terminal receiving chamber 45, and a pin-like electrical contact portion 48 which projects from a distal end of the body portion 46 into a connector engaging chamber 47 of the checking part 42 (see FIG. 6). An electric wire 49 is press fitted to a backward end of the body portion 46. The lance 44 has a projection 50 adjacent to its distal end which is adapted to be engaged in a hole in a forward end part of the body portion 46 to prevent withdrawal of the terminal 41.

In FIG. 1, the distal end portion of the lance displacement detecting pin 34 of the set pin 31 has entered into a flexing space 52 in the connector housing 43 through a front opening 51. The distal end of the continuity checking pin 38 is in contact with a distal end of the electrical contact portion 48 of the terminal 41. A backward end of the continuity checking pin 38 is in contact with a front end of a probe pin 53 (see FIG. 6). Presence of continuity is detected by an indication of a checker (not shown) which connects a lead wire 54 (see FIG. 6) of the probe pin 53 and the electric wire 49 of the terminal.

A terminal receiving portion 55 in a concave conical shape presenting a V-shape in cross section is formed at the distal end of the continuity checking pin 38. By providing the terminal receiving portion 55, the distal end of the electrical contact portion 48 can be reliably caught. An inclination angle of the conical shaped terminal receiving portion 55 is set to be equal to an inclination angle of the distal end of the electrical contact portion 48 or more.

In case where the electrical contact portion 48 is not in a columnar shape but a plate-like shape having a small width, the inclination angle of the conical shaped terminal receiving portion 55 is set to be equal to a larger one of the vertical or lateral inclination angles of the distal end of the electrical contact portion 48 or more. In this manner, the terminal receiving portion 55 is capable of corresponding to all the shapes of the electrical contact portion 48. Moreover, the terminal receiving portion 55 may be formed as a recess in a barrel-like shape presenting a U-shape in cross section.

Needless to say, by forming the terminal receiving portion 55 in the V- or U-shape in cross section, a wider guiding area for the electrical contact portion 48 can be obtained than with a simple recess.

FIG. 2 shows a case where the terminal 41 has been incompletely inserted into the connector housing 43. A lance receiving portion 56 in a U-shape in cross section is formed at the distal end of the lance displacement detecting pin 34 to a full extent of its width. The lance 44 is pressed by a bottom face of the terminal 41 and deflected in the flexing space 52. When the distal end of the lance displacement detecting pin 34 is abutted against the distal end of the lance 44 for the check, there will be created a gap S between the distal end of the continuity checking pin 38 and the distal end of the electrical contact portion 48 of the terminal 41, resulting in an NG (no continuity) of the insertion check. An abnormal condition, that is, incomplete insertion of the terminal 41 can be thus detected.

Even in case where the lance displacement detecting pin 34 is abutted against the distal end of the lance 44, and the lance displacement detecting pin 34 is apt to move with its speed and load, the lance displacement detecting pin 34 will not escape from the distal end of the lance 44, because the distal end of the lance 44 has been inserted into the lance receiving portion 56. It is to be noted that the lance receiving portion 56 may be in a form of a recess in a V-shape in cross section. By forming the lance receiving portion 56 in the V- or U-shape in cross section, a wider guiding area (wider in a direction of intersecting the above described width) for the distal end portion of the lance 44 can be obtained than with a simple recess.

Figure 3:
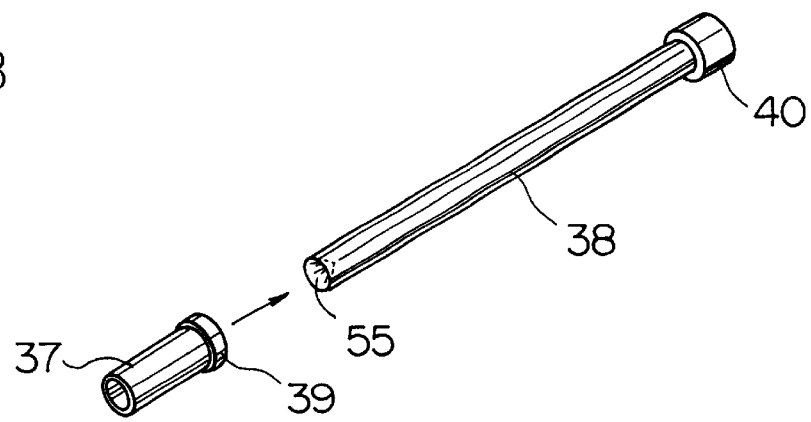
FIG. 3 is an exploded perspective view of a continuity checking pin.
Figure 4:
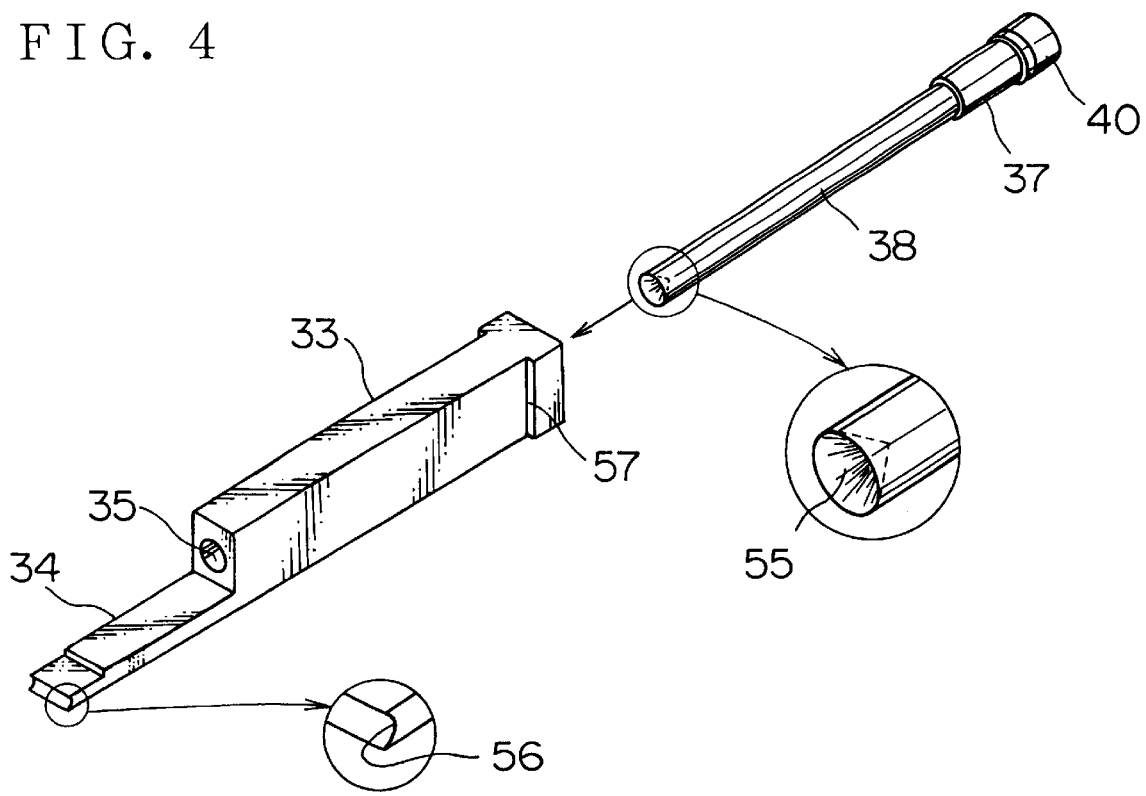
FIG. 4 is an exploded perspective view of a set pin showing a state where the continuity checking pin is assembled to a block section (encircled is an enlarged view)
Figure 5:
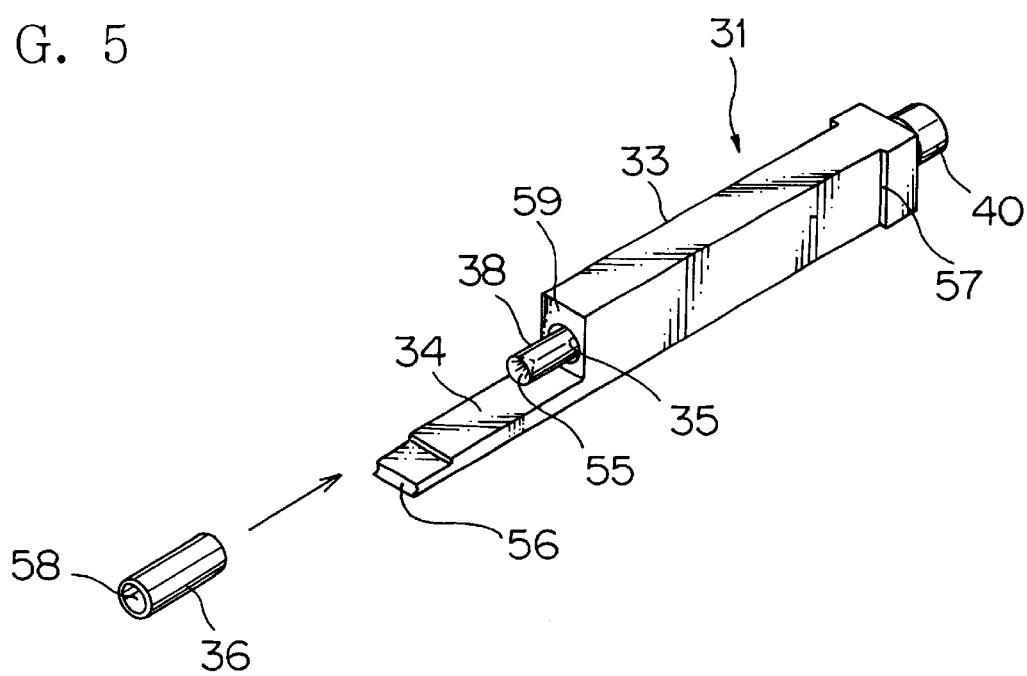
FIG. 5 is an exploded perspective view of the set pin showing a state where an insulating forward sleeve is assembled to the continuity checking pin.

FIGS. 3 to 5 show steps of assembling the set pin 31 in order. At first, the first (backward) insulating sleeve 37 is pushed around the continuity checking pin 38 in a cylindrical shape from the front end and press fitted by a pushing jig (not shown). A press fitting allowance is about 0.1 mm in diameter. Then, as shown in FIG. 4, the backward insulating sleeve 37 is abutted against the flange portion 40 at the rear end of the continuity checking pin 38 and stopped there.

In the next step, the continuity checking pin 38 is inserted into the bore 35 in the block section 33 of the lance displacement detecting pin 34, until the backward insulating sleeve 37 is press fitted in the bore 35. The press fitting work is conducted, for example, by tapping the backward end of the continuity checking pin 38 with a hammer. The bore 35 is formed so as to pass through the block section 33 in a longitudinal direction. The block section 33 is formed in a rectangular columnar shape, and from one side of its front end, the plate-like lance displacement detecting pin 34 is projected. The block section 33 is formed with a stepped portion 57 as a stopper for defining an advanced position of the set pin 31.

Then, as shown in FIG. 5, the forward end portion of the continuity checking pin 38 which has passed through the block section 33 projects forward from the front end of the block section 33. The second (forward) insulating sleeve 36 in a cylindrical shape is press fitted into the bore 35 along the continuity checking pin 38. A front end 58 of the forward insulating sleeve 36 is flush with a front end 59 of the block section 33. The front end portion of the continuity checking pin 38 is positioned in parallel to the lance displacement detecting pin 34.

By employing a pair of the forward and backward insulating sleeves 36, 37 as shown in FIG. 1, the continuity checking pin 38 is accurately positioned and stably fixed in the block section 33. Even though the continuity checking pin 38 is long sized, it can be supported at two positions in a longitudinal direction by means of a pair of the insulating sleeves 36 and 37, and so, reliably prevented from wobbling, assuring a stable posture and uprightness.

Figure 6:
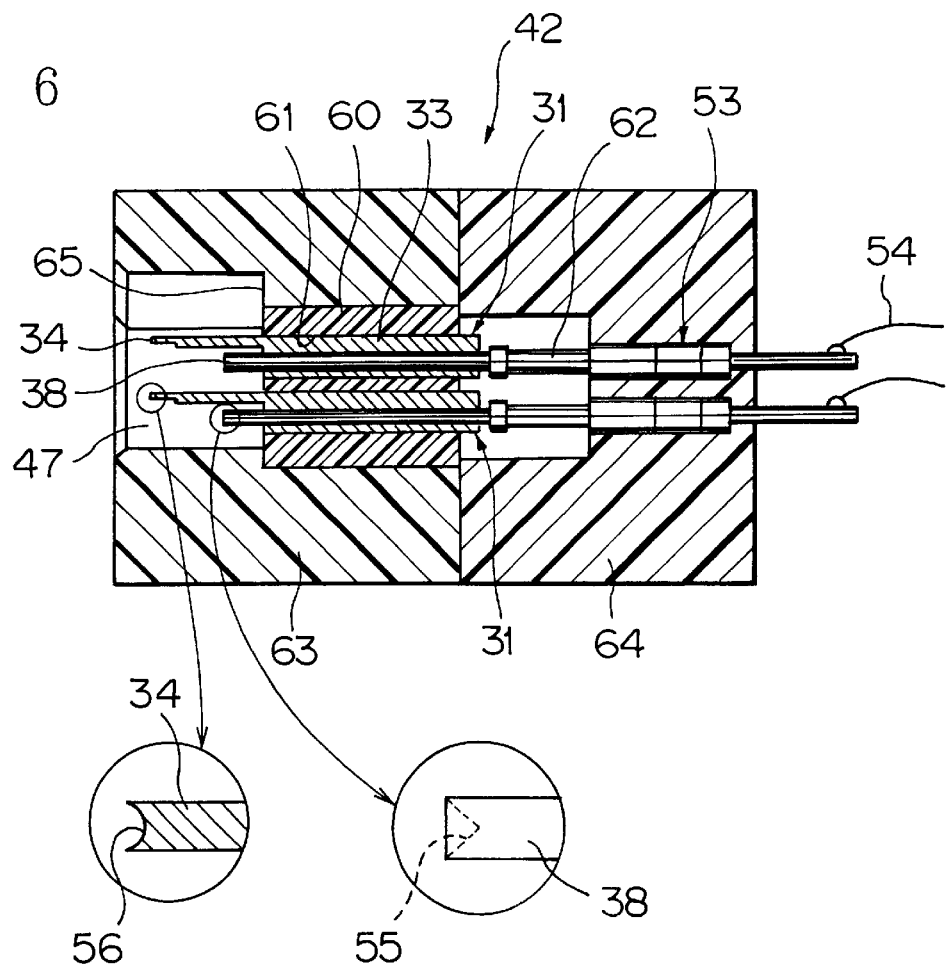
FIG. 6 is a sectional view showing a checking part of the connector continuity checking device (encircled is an enlarged view)
Figure 8:
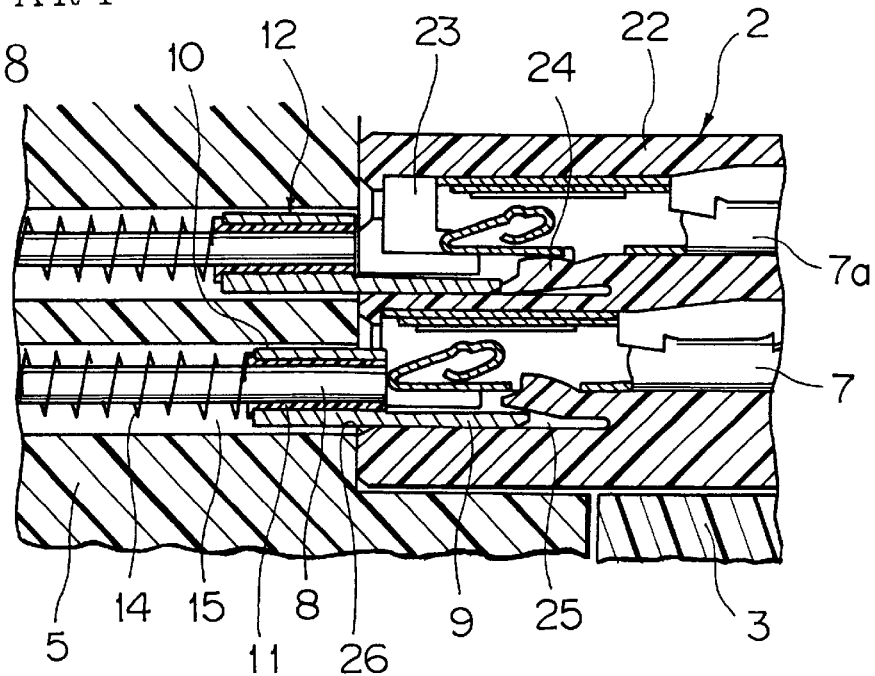
FIG. 8 is a sectional view showing a state where a connector is engaged in the conventional connector continuity checking device to check continuity.

FIG. 6 shows the checking part 42 of the connector continuity checking device. In the checking part 42, a plurality of the set pins 31 are inserted in and guided by guide holes 61 in a pin guide 60 formed of synthetic resin or metal to be engaged slidably in back and forth directions. Forward movement of each of the set pins 31 is restricted by the stepped portion 57 as shown in FIG. 4. Sliding portions 62 of the probe pins 53 are in contact with the backward ends of the continuity checking pins 38 and biased forward by means of coil springs (not shown) provided inside. Lead wires 54 are connected to backward ends of the probe pins 53. Each of the set pins 31 can move back and forth independently, and the check of continuity and incomplete insertion of the terminal 41 (see FIG. 1) can be separately conducted with each of the set pins 31.

The pin guide 60 is fixed within a guide block 63 made of metal, and the probe pins 53 are fixed in a pin block 64 made of synthetic resin. The guide block 63 and the pin block 64 are fastened and fixed by means of bolts (not shown). The guide block 63 has the connector engaging chamber 47 at its front side, and a front end of the pin guide 60 is flush with a bottom wall 65 of the connector engaging chamber 47. The lance displacement detecting pins 34 and the continuity checking pins 38 are projected into the connector engaging chamber 47.

Although the present invention has been fully described by way of examples referring to the accompanying drawings, it is to be noted that various changes and modifications will be apparent to those skilled in the art.

What is claimed is:

1. A connector continuity checking device comprising:

continuity checking pins disposed in opposing relationship to terminals in a connector, and lance displacement detecting pins disposed in opposing relationship to lances in the connector having elasticity and adapted to lock said terminals in said connector, wherein said continuity checking pins are provided at their distal ends with concave terminal receiving portions to receive distal ends of said terminals of the connector, and said lance displacement detecting pins are provided at their distal ends with concave lance receiving portions to receive distal ends of said lances of the connector.

2. The connector continuity checking device as claimed in claim 1, wherein said concave terminal receiving portions and said concave lance receiving portions are formed in a U-shape or a V-shape in cross section.

* * * * *